(12) United States Patent
Weaver, Jr. et al.

(10) Patent No.: US 7,201,497 B2
(45) Date of Patent: Apr. 10, 2007

(54) LED LIGHTING SYSTEM WITH REFLECTIVE BOARD

(75) Inventors: Stanton Earl Weaver, Jr., Northville, NY (US); Thomas Elliot Stecher, Scotia, NY (US)

(73) Assignee: Lumination, LLC, Valley View, OH (US)

( * ) Notice: Subject to any disclaimer, the term of this patent is extended or adjusted under 35 U.S.C. 154(b) by 97 days.

(21) Appl. No.: 10/891,722

(22) Filed: Jul. 15, 2004

(65) Prior Publication Data

US 2006/0012991 A1    Jan. 19, 2006

(51) Int. Cl.
*F21V 7/00* (2006.01)

(52) U.S. Cl. ...................... 362/296; 362/247

(58) Field of Classification Search ............. 362/800
See application file for complete search history.

(56) References Cited

U.S. PATENT DOCUMENTS

| | | | | |
|---|---|---|---|---|
| 2,985,787 | A * | 5/1961 | Scott ........................... | 313/493 |
| 5,094,788 | A | 3/1992 | Schrenk et al. | |
| 5,122,905 | A | 6/1992 | Wheatley et al. | |
| 5,269,995 | A | 12/1993 | Ramanathan et al. | |
| 5,389,324 | A | 2/1995 | Lewis et al. | |
| 5,882,774 | A | 3/1999 | Jonza et al. | |
| 5,976,424 | A | 11/1999 | Weber et al. | |
| 6,080,467 | A | 6/2000 | Weber et al. | |
| 6,088,163 | A | 7/2000 | Gilbert et al. | |
| 6,101,032 | A | 8/2000 | Wortman et al. | |
| 6,117,530 | A | 9/2000 | Jonza et al. | |
| 6,157,490 | A | 12/2000 | Wheatley et al. | |
| 6,161,910 | A * | 12/2000 | Reisenauer et al. ......... | 362/800 |
| 6,208,466 | B1 | 3/2001 | Liu et al. | |
| 6,210,785 | B1 | 4/2001 | Weber et al. | |
| 6,296,927 | B1 | 10/2001 | Jonza et al. | |
| 6,576,382 | B2 * | 6/2003 | Day et al. ...................... | 430/18 |
| 6,680,490 | B2 * | 1/2004 | Yasukawa et al. ............ | 257/98 |
| 6,738,112 | B1 * | 5/2004 | Sekiguchi ..................... | 349/63 |
| 2002/0176250 | A1 * | 11/2002 | Bohler et al. ............... | 362/236 |
| 2003/0193055 | A1 | 10/2003 | Martter et al. | |
| 2004/0042212 | A1 | 3/2004 | Du et al. | |

FOREIGN PATENT DOCUMENTS

| EP | 0835407 | 10/2001 |
|---|---|---|
| WO | WO 03/087660 | 10/2003 |

OTHER PUBLICATIONS

"Scotchlite Permanent Sign Sheeting and Film," 3M Electronics Manufacturing IPC, pp. 1-12, (2000).
"Vikuiti Enhanced Specular Reflector Film," 3M Electronics Manufacturing, at http://products3.3m.com, Jun. 3, 2004.

* cited by examiner

*Primary Examiner*—Ali Alavi
*Assistant Examiner*—William J. Carter
(74) *Attorney, Agent, or Firm*—Fay Sharpe LLP

(57) ABSTRACT

A light emitting apparatus (8) includes one or more light emitting chips (10) that are disposed on a printed circuit board (12) and emit light predominantly in a wavelength range between about 400 nanometers and about 470 nanometers. The printed circuit board includes: (i) an electrically insulating board (14); (ii) electrically conductive printed circuitry (20); and (iii) an electrically insulating solder mask (22) having vias (24) through which the one or more light emitting chips electrically contact the printed circuitry. The solder mask (22) has a reflectance of greater than 60% at least between about 400 nanometers and about 470 nanometers.

17 Claims, 6 Drawing Sheets

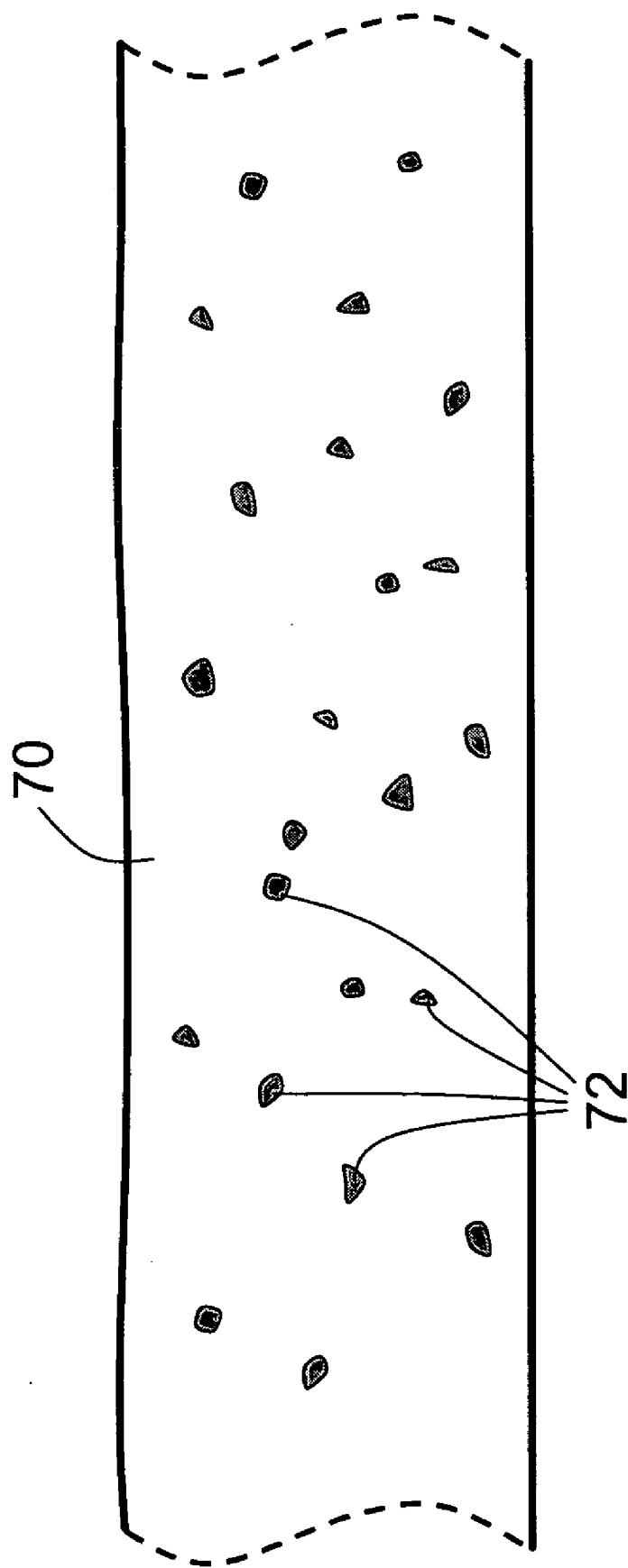

LED LIGHTING SYSTEM WITH REFLECTIVE BOARD

BACKGROUND

The present invention relates to the lighting arts. It especially relates to high intensity light emitting diode packages, components, apparatuses, and so forth, and will be described with particular reference thereto. However, the invention will also find application in conjunction with other solid state light emitters such as vertical cavity surface emitting lasers.

High brightness light emitting packages typically employ a plurality of light emitting diode chips, surface emitting laser chips, organic light emitter chips, or the like. To mechanically support the chips and to electrically interconnect the chips, in some light emitting packages the light emitting chips are disposed on a printed circuit board. The printed circuit board can also support and electrically incorporate discrete electronic components, application-specific integrated circuits (ASICs), programmable microprocessors, or the like, for providing input power conditioning, light output control, electrostatic discharge protection, or other functions.

Disadvantageously, the printed circuit board can contribute to optical losses by partially absorbing light that impinges upon the printed circuit board. Printed circuit boards typically include a topmost epoxy solder mask layer having lithographically defined openings through which the light emitting chips or other electronic components electrically contact bonding pads of the printed circuitry. In conventional printed circuit boards for electronic applications, the solder mask layer is not optimized for its optical properties, and is thus not very reflective.

For high brightness light emitting packages, printed circuit boards having a commercially available white solder mask are sometimes used. These white solder masks contain white talc or another white material that reflects visible light. White solder masks provide a substantial improvement in reflectance of visible light over conventional blue or green solder masks.

However, white solder masks have certain disadvantages for some high brightness light emitting packages. First, while the white solder mask appears to be highly reflective, the inventors have measured the reflectance of such boards and have found that the reflectance is only about 80% or less in the visible spectral region. If 50% of the visible light produced by the light emitting package impinges on the printed circuit board, this reflectance corresponds to optical losses of around 10% or higher due to absorption in the printed circuit board.

Moreover, the reflectance of the white solder masks decreases in the blue, violet, and ultraviolet spectral regions. The inventors have found the white solder board reflectance decreases below 60% for wavelengths less than about 410 nm. In certain light emitting packages, wide-bandgap light emitting chips emitting blue, violet, or ultraviolet light emission are coupled with a phosphor that converts the light emission into white or another selected visible light. In such packages, a substantial amount of blue, violet, or ultraviolet light typically reflects from the phosphor toward the printed circuit board. The relatively low reflectance of white solder masks for blue, violet, or ultraviolet wavelength light degrades the light output efficiency of these packages.

An approach for achieving high reflectances in the blue, violet, or ultraviolet would be to use a metallic reflector. However, incorporating a metallic reflector, which is generally electrically conductive, into a solder mask is problematic since the solder mask is in contact with or in close proximity to the printed circuitry and electronic component leads.

The present invention contemplates improved apparatuses and methods that overcomes the above-mentioned limitations and others.

BRIEF SUMMARY

According to one aspect, a light emitting apparatus is disclosed. One or more light emitting chips are disposed on a printed circuit board and emit light predominantly in a wavelength range between about 400 nanometers and about 470 nanometers. The printed, circuit board includes: (i) an electrically insulating board; (ii) electrically conductive printed circuitry; and (iii) an electrically insulating solder mask having vias through which the one or more light emitting chips electrically contact the printed circuitry. The solder mask has a reflectance of greater than 60% at least between about 400 nanometers and about 470 nanometers. Optionally, the electrically insulating board and the electrically conductive printed circuitry of the printed circuit board may include a plurality of electrically insulating layers and a plurality of layers of printed circuitry.

According to another aspect, a method is provided for fabricating a light emitting apparatus. An electrically insulating board is provided with electrically conductive printed circuitry disposed thereon. An electrically insulating solder mask is disposed on the electrically insulating board. The solder mask has vias accessing the printed circuitry, and has a reflectance of greater than 60% at least between about 400 nanometers and about 470 nanometers. One or more light emitting chips are disposed on the insulating solder mask. The one or more light emitting chips electrically contact the printed circuitry through the vias in the solder mask, and emit light predominantly in a wavelength range between about 400 nanometers and about 470 nanometers.

According to yet another aspect, a light emitting apparatus is disclosed. One or more light emitting chips are disposed on a printed circuit board and emit light predominantly in a wavelength range between about 400 nanometers and about 470 nanometers. The printed circuit board includes: (i) an electrically insulating board; (ii) electrically conductive printed circuitry; and (iii) an electrically insulating solder mask having vias through which the one or more light emitting chips electrically contact the printed circuitry. The solder mask has a reflectance of greater than 60% at least between about 400 nanometers and about 470 nanometers. A phosphor is arranged to be irradiated by the one or more light emitting chips and emits light in a wavelength range predominantly above 470 nanometers responsive to the irradiating. The phosphor and the printed circuit board are relatively arranged such that at least some of the light emitted by the one or more light emitting chips predominantly in the wavelength range between about 400 nanometers and about 470 nanometers reflects from the phosphor onto the solder mask of the printed circuit board.

Numerous advantages and benefits of the present invention will become apparent to those of ordinary skill in the art upon reading and understanding the present specification.

BRIEF DESCRIPTION OF THE DRAWINGS

The invention may take form in various components and arrangements of components, and in various process operations and arrangements of process operations. The drawings are only for purposes of illustrating preferred embodiments and are not to be construed as limiting the invention. In the drawings, layer thicknesses, coating thicknesses, and other dimensions are not drawn to scale.

In FIG. 1, one sidewall of the housing is removed to reveal internal components of the light emitting package.

FIG. 6 shows a cross-section of a portion of a solder mask suitable for use in the package of FIG. 1.

DETAILED DESCRIPTION OF PREFERRED EMBODIMENTS

Figure 1:
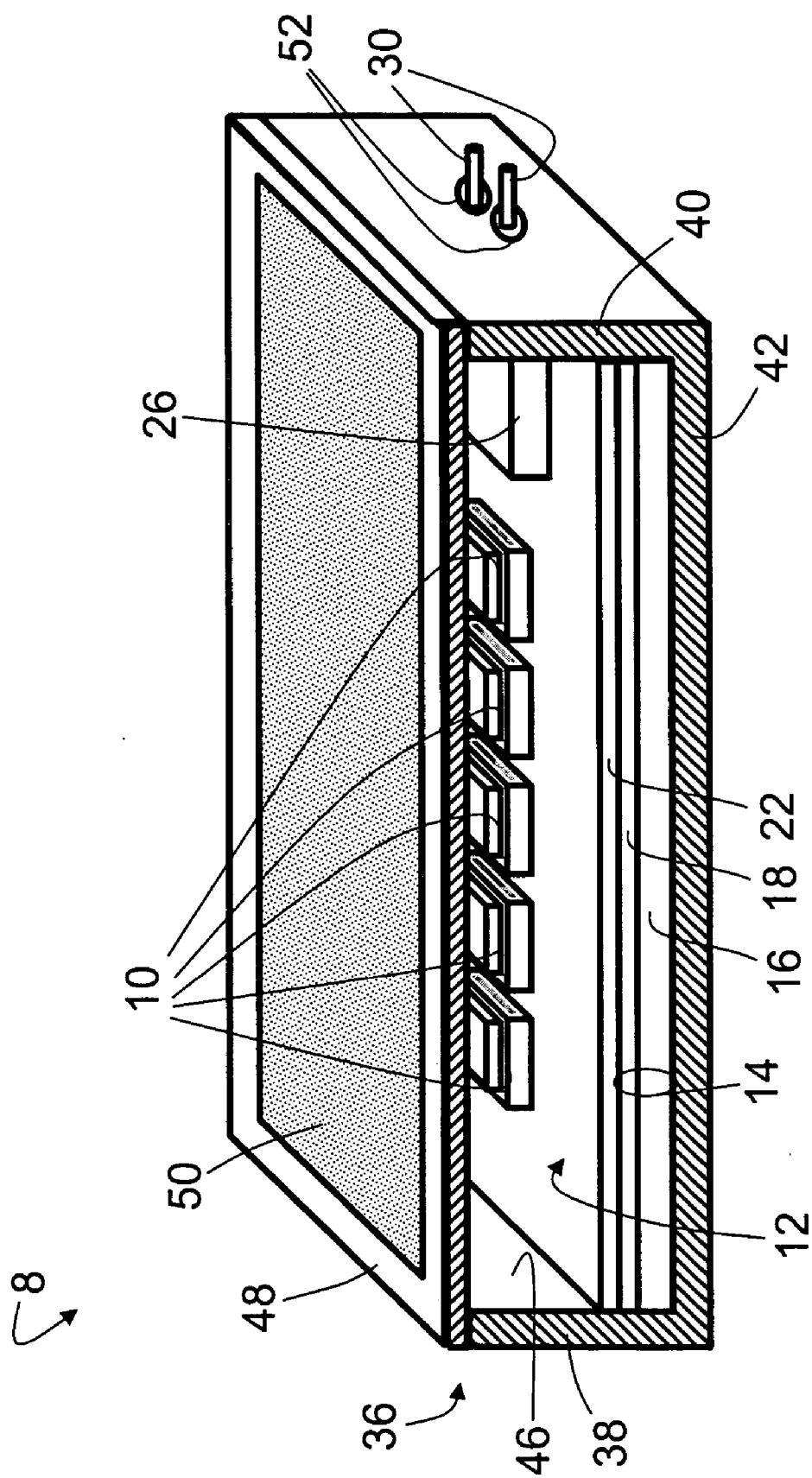
FIG. 1 shows a perspective view of a light emitting package.
Figure 2:
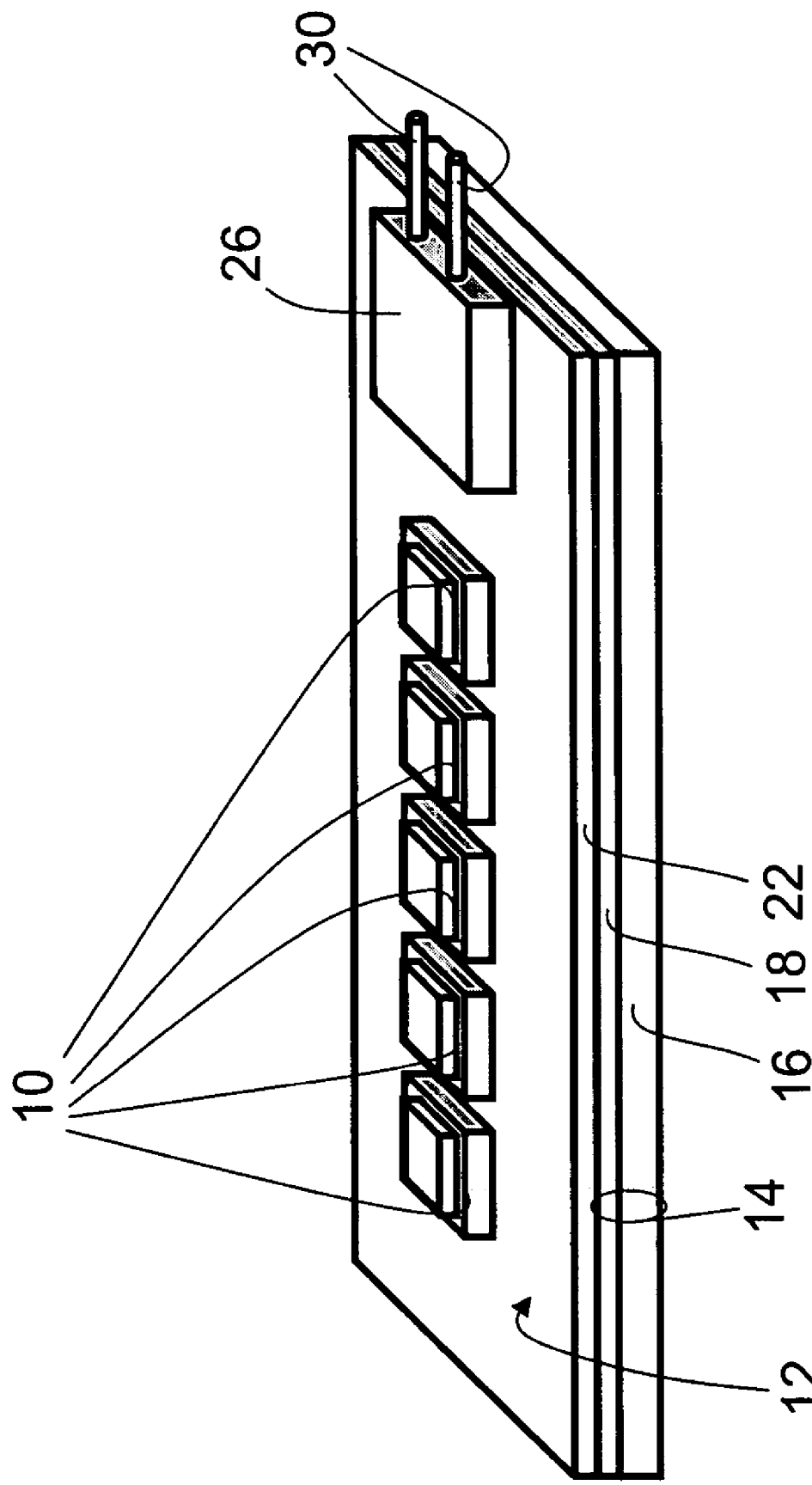
FIG. 2 shows a perspective view of the printed circuit board and electronic components of the package of FIG. 1.
Figure 3:
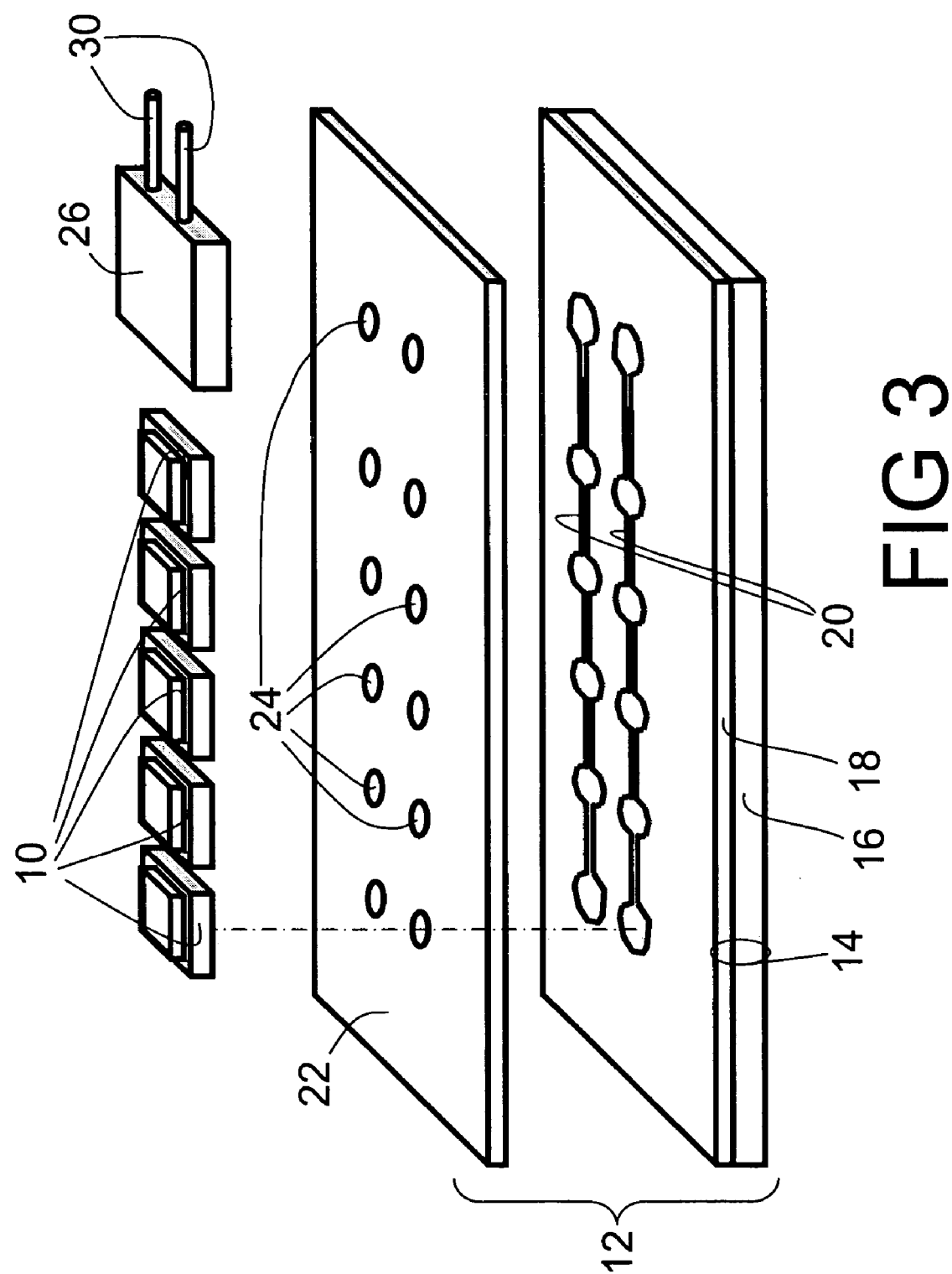
FIG. 3 shows an exploded perspective view of the printed circuit board and electronic components of the package of FIG. 1.

With reference to FIGS. 1–3, a light emitting package 8 includes a plurality of light emitting chips 10 disposed on a printed circuit board 12. The illustrated printed circuit board 12 includes an electrically insulating board 14, which in the illustrated embodiment includes a conductive metal core 16 and an insulating layer 18 made of a fiberglass resin or another electrically insulating material. In some embodiments, the conductive metal core 16 is omitted: for example, the electrically insulating board may be a fiberglass resin board without a metal core. Electrically conductive printed circuitry 20 (shown in FIG. 3) is disposed on the insulating layer 18 of the insulating board 14. A solder mask 22 is disposed on the insulating board 16 and includes openings or vias 24 (shown in FIG. 3) through which the light emitting chips 10 electrically contact the printed circuitry 20. Optionally, one or more additional electronic components, such as the example electronic component 26, are also disposed on the printed circuit board 12 and electrically contact the printed circuitry 20 by the openings or vias 24.

In the illustrated example, an electronic component 26 receives electrical power through contact pins 30 and rectifies, converts, or otherwise conditions the received electrical power to produce operating power delivered to the printed circuitry 20 to operate the light emitting chips 10. Optionally, the electronic component 26 or another electronic component can provide electrostatic discharge protection, selectable switching, or the like. The electronic component 26 can be embodied as an application-specific integrated circuit (ASIC), a programmed microcontroller or microprocessor, or the like. Alternatively or additionally, electronic components can be embodied by discrete components such as resistors, inductors, capacitors, op-amps, digital logic gates, or the like which are interconnected by the printed circuitry to perform power conditioning, switching, a light dimming function, or so forth.

In the illustrated embodiment, the electrically insulating board 14 of the printed circuit board 12 is a metal core board that includes the planar conductive metal core 16, such as an aluminum plate, copper foil, or the like, along with the insulating layer 18. The insulating layer 18 can be, for example, a fiberglass resin sheet or coating, which electrically isolates the printed circuitry 20 from the metal core 16. Optionally, the printed circuitry 20 electrically contacts the metal core 16 at selected points through vias (not shown) formed in the insulating layer 18, such that the metal core 16 acts as a ground plate for the printed circuitry 20. The metal core 16 also spreads and/or dissipates heat generated by the light emitting chips 10 and the one or more electronic components 26.

The light emitting chips 10, the one or more electronic components 26, and the printed circuit board 12 are housed in a housing 36 (shown in FIG. 1). The housing 36 includes sidewalls 38, 40 and a bottom 42 on which the printed circuit board 12 is disposed. (One sidewall is omitted in FIG. 1 to reveal the internal components of the light emitting package 10; a second sidewall is disposed opposite the removed sidewall and is not visible in the perspective view of FIG. 1). The sidewalls 38, 40 preferably have reflective interior surfaces 46. For example, the sidewalls 38, 40 and bottom 42 can define a rectangular metal box which, in addition to providing reflective interior surfaces 46, also provides a thermal heat sink for the example metal core printed circuit board 12. A top 48 of the housing 36 faces the light emitting chips 10 includes a phosphor plate 50.

In operation, the light emitting chips 10 emit blue, violet, or ultraviolet light predominantly in a wavelength range between about 400 nanometers and about 470 nanometers. The emitted blue, violet, or ultraviolet light irradiates the phosphor plate 50. A phosphor disposed on or dispersed in the phosphor plate 50 emits fluorescence or phosphorescence predominantly in a wavelength range above 470 nanometers responsive to the blue, violet, or ultraviolet irradiation. The phosphor plate 50 is light-transmissive for the fluorescence or phosphorescence so that the light emitting package 8 outputs light due to the fluorescence or phosphorescence.

In some embodiments, the phosphor includes one or more constituents that produce a white fluorescence or phosphorescence. In other embodiments the phosphor includes one or more constituents that produce fluorescence or phosphorescence of a selected color or blend of colors. Optionally, the phosphor plate 50 is also light-transmissive for the blue, violet, or ultraviolet irradiation produced by the light emitting chips 10, so that the light output of the light emitting package 8 is a combination of the fluorescence or phosphorescence output by the phosphor and direct light output by the light emitting chips 10. For example, in some embodiments the light emitting chips 10 produce blue emission light and the phosphor produces yellow light, so that the blended direct and phosphor-generated light combine in the output of the light emitting package 8 to approximate white light. The reflective interior surfaces 46 of the sidewalls 38, 40 reflect light produced by the light emitting chips 10 that impinges on the sidewalls 38, 40 toward the phosphor plate 50 to improve light extraction efficiency.

In the illustrated embodiment, the sidewall 40 includes electrically insulated feedthrough openings 52 through which the contact pins 30 of the electronic component 26 pass to enable connection of an electrical power source to the light emitting package 8. Other power input configurations can also be used, such as a female power receptacle, a hard-wired electrical power cable, or the like. Optionally, a battery (not shown) is included in the light emitting package so that no external power supply is needed.

It will be appreciated that the housing 36 is only an example. The housing can have other shapes besides rectangular, can include phosphorized sidewalls in addition to or in place of the phosphorized top, or can include other modifications. In some embodiments, the housing includes a phosphorized dome arranged over the light emitting chips. The light emitting package 8 can also include additional or other components, such as a heat sink, heat radiating fins, a lens or other optical component or components optically coupled with the phosphor plate 50, lensing for focusing the light emitting chip emission onto a phosphorized window or region, or so forth.

Figure 5:
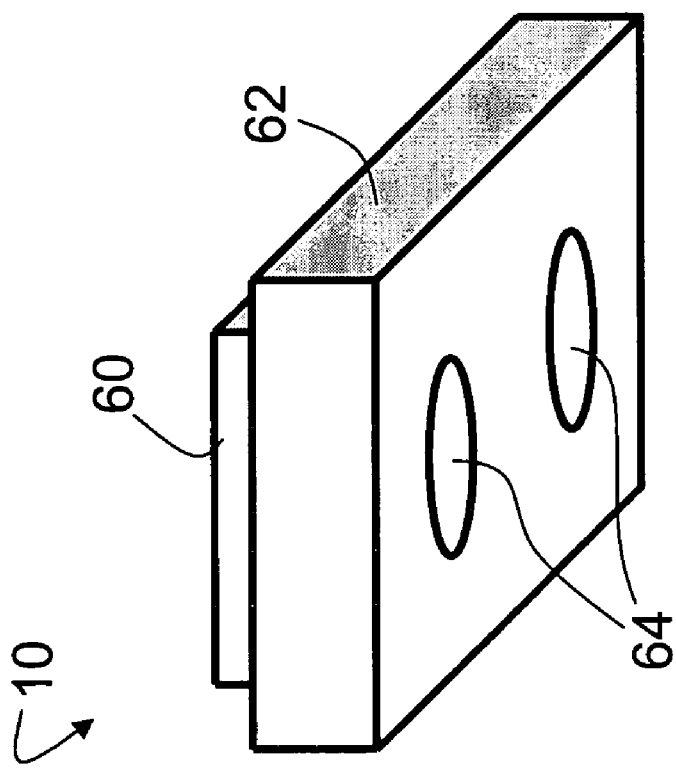
FIGS. 4 and 5 show perspective views of one of the light emitting chips of the package of FIG. 1 from two different vantage points.
Figure 4:
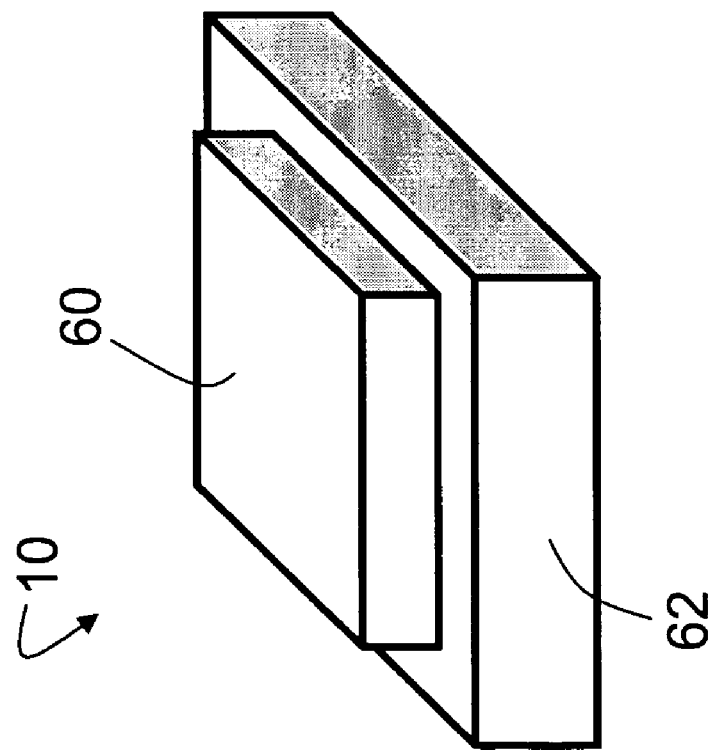

With continuing reference to FIGS. 1–3 and with further reference to FIGS. 4 and 5, each light emitting chip 10 can be a light emitting diode, a vertical cavity surface emitting laser (VCSEL), a monolithic array of light emitting diodes or lasers, an organic light emitting chip, or the like. In the illustrated embodiment, each light emitting chip 10 includes a semiconductor chip 60 flip-chip bonded to a sub-mount 62. The sub-mount 62 includes electrical vias electrically connecting the semiconductor chip 60 with backside bonding pads 64. The illustrated light emitting chip 10 is only an example; in other embodiments the light emitting chip may be direct-bonded to the printed circuit board 12 without a sub-mount, or may be bonded to a sub-mount but electrically contacted to the printed circuit board using wire bonds, or may be flip-chip bonded to bonding pads of a sub-mount which sub-mount bonding pads are electrically connected with the printed circuit board 12 by wire bonds, or so forth.

In some embodiments, the light emitting chips are group III-nitride based light emitting diodes or lasers emitting light predominantly in a wavelength range between about 400 nanometers and about 470 nanometers. Other blue, violet, or ultraviolet light emitting chips can be employed which emit light predominantly in a wavelength range between about 400 nanometers and about 470 nanometers. In some embodiments, the electrical connections of the light emitting chips 10 to the printed circuit board 12 are produced by soldering. The solder mask 22 keeps the solder in the areas of the vias 24. In other embodiments, thermosonic bonding, thermocompressive bonding, or another bonding technique is used. Regardless of whether soldering or another bonding technique employed, the solder mask 22 protects the printed circuitry 20 from abrasion or other physical damage.

To maximize light extraction efficiency, the solder mask 22 of the printed circuit board 12 is constructed to have a reflectance of greater than 60% at least between about 400 nanometers and about 470 nanometers. In this way, the blue, violet, or ultraviolet light emitted by the light emitting chips 10 which directly impinges upon the solder mask 22 (or which reflects off the sidewalls 38, 40 and/or the phosphor plate 50 and then impinges upon the solder mask 22) is substantially reflected toward the phosphor plate 50 to contribute to generation of phosphorescence or fluorescence. In some preferred embodiments, the solder mask 22 of the printed circuit board 12 is constructed to have a reflectance of greater than about 85% at least between about 400 nanometers and about 470 nanometers. In some preferred embodiments, the solder mask 22 of the printed circuit board 12 is constructed to have a reflectance of greater than about 85% at least between about 400 nanometers and about 740 nanometers, so that the solder mask 22 also reflects phosphorescence or fluorescence generated by the irradiated phosphor that is directed toward the printed circuit board 12. In some preferred embodiments, the solder mask 22 of the printed circuit board 12 is constructed to have a reflectance of greater than about 85% at least between about 400 nanometers and an upper wavelength substantially spanning the wavelength range of light emitted by the phosphor (for example, at least up to an upper wavelength of 650 nanometers for an example phosphor emitting light predominantly in a wavelength range of 500–650 nanometers).

With reference to FIG. 6, in some embodiments, the electrically insulating solder mask 22 is formed of a film of photostabilized electrically insulating binder material 70, such as a photosensitive epoxy, a photosensitive polyimide, or so forth, in which particles of a reflective filler material 72 are dispersed. The particles of reflective filler material 72 can be, for example, a titanium oxide (such as titanium dioxide, $TiO_2$), an aluminum oxide (such as alumina, $Al_2O_3$), a high-refractive index glass, or so forth. The concentration of filler material 72 in the binder material 70 as well as the mean particle size, average particle shape, and so forth are selected to provide adequate reflectance for the solder mask 22. An electrically conductive filler material can be employed if its concentration is dilute enough to retain the substantially electrically insulating characteristic of the solder mask 22.

In one example, in which the binder material is a negative photosensitive epoxy, the solder mask 22 is constructed as follows. The constituents of the photosensitive epoxy are combined with the filler material 72 to generate a liquid photosensitive epoxy source material, which is disposed on the electrically insulating board 14 as a film. Suitable deposition methods include spray coating, curtain coating, or so forth. Depending upon the type of epoxy, a soft cure may be performed to partially harden or solidify the photosensitive epoxy film. Soft curing is not employed with some types of epoxy, however. These processes are performed in a yellow-lighted photolithography room or other environment whose ambient illumination does not activate the photosensitive epoxy.

The vias 24 of the solder mask 22 are then formed by optically exposing the photosensitive epoxy film through a photo-mask that blocks light exposure in the areas of the vias 24. The optically exposed photosensitive epoxy film is developed using suitable chemicals which remove only those areas of the photosensitive epoxy film which have not been exposed to light; thus, the areas of the vias 24 which were blocked from light exposure are removed to open up the vias 24. Those areas which were exposed to light are photostabilized and are not removed by the developer chemical or chemicals. Depending upon the type of photosensitive epoxy, a hard cure may be performed to further solidify or harden the photostabilized epoxy film.

In some embodiments, the concentration of filler material 72 is low enough so that incorporation of the filler material 72 does not significantly alter the photosensitive characteristics of the photosensitive binder material 70. In other embodiments, incorporation of the filler material 72 reduces the photosensitivity of the photosensitive binder material 70. In these embodiments, the amount of photosensitizer in the photosensitive binder material 70 can be increased to counteract the effect of the filler material 72, or the light exposure and/or developing time can be increased to account for the reduced photosensitivity. Typically, the solder mask 22 is between about twelve microns and seventy-five microns thick. For a relatively thicker solder mask, the concentration of the filler material 72 can generally be reduced while retaining the desired reflectance. Filler materials such as $TiO_2$ or $Al_2O_3$ exhibit reflectances greater than about 85% to 90% at least down to 400 nanometers, and more typically at least down to about 350 nanometers. Hence, for sufficiently high concentrations of filler material 72, the reflectance of the solder mask 22 can be increased to above 60% or above 85% (depending upon the filler concentration, reflectance characteristics of the particles, and so forth) in the wavelength range between about 400 nanometers and about 470 nanometers.

Figure 7:
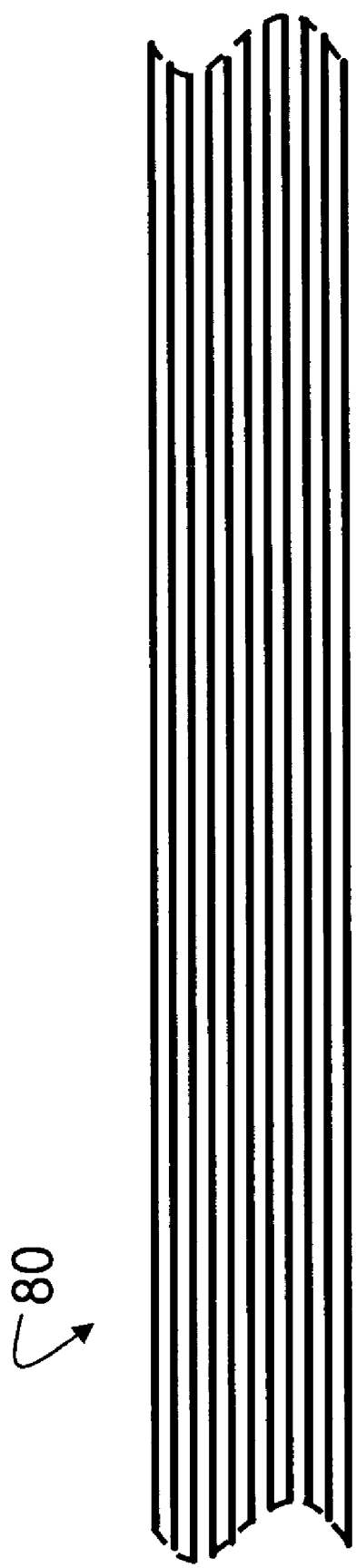
FIG. 7 shows a cross-section of a portion of another solder mask suitable for use in the package of FIG. 1.

With reference to FIG. 7, in some embodiments, the electrically insulating solder mask 22 is formed of a multiple-layer specular reflector sheet 80. Openings are cut into the sheet 80 to define the vias 24, for example using laser cutting, mechanical punching, or so forth, and the multiple-layer specular reflector sheet 80 is glued or otherwise secured to the electrically insulating board 14. The reflector sheet 80 includes a stack of reflective dielectric layers including alternating layers of dielectric material having different refractive indices, different birefringence characteristics, or other dissimilar optical characteristics. The thicknesses and optical characteristics of the layers are selected to provide a high stack reflectance in the wavelength range between about 400 nanometers and about 470 nanometers, and preferably in the wavelength range between about 400 nanometers and about 740 nanometers.

In some embodiments, the multiple-layer specular reflector sheet 80 is a commercially available reflector sheet, such as a VM2000 reflector film or a Vikuiti™ enhanced specular reflector film or a (available from 3M, St. Paul, Minn.). Solder masks formed of VM2000 or Vikuiti™ enhanced specular reflector films have been measured by the inventors to have reflectances greater than 85% between 400 nanometers and 740 nanometers, with these high reflectances being observed for both front and back sides of the film. In contrast, a conventional white solder mask was measured to have reflectances of about 80% in the visible, reflectances of less than about 70% for wavelengths below about 430 nanometers, and reflectances of less than 60% for wavelengths below about 410 nanometers.

The light emitting package 8 produces visible light through wavelength conversion by the phosphor plate 50. In other contemplated embodiments, the light emitting package is a blue, violet, or ultraviolet light source that emits the direct light produced by the light emitting chips predominantly in the wavelength range between about 400 nanometers and about 470 nanometers. In these embodiments, optics, sidewalls, lenses, cover glasses, or so forth will generally reflect or otherwise redirect some of the direct light predominantly in the wavelength range between about 400 nanometers and about 470 nanometers toward the solder mask of the printed circuit board. Hence, the solder masks disclosed herein which are highly reflective at least between about 400 nanometers and about 470 nanometers are also advantageous in these blue, violet, or ultraviolet light sources that do not employ phosphor.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A light emitting apparatus comprising:
   one or more light emitting chips emitting light predominantly in a wavelength range between about 400 nanometers and about 470 nanometers; and
   a printed circuit board on which the one or more light emitting chips are disposed, the printed circuit board including:
   (i) an electrically insulating board, (ii) electrically conductive printed circuitry, and (iii) an electrically insulating solder mask having vias through which the one or more light emitting chips electrically contact the printed circuitry, the solder mask having a reflectance of greater than 60% at least between about 400 nanometers and about 470 nanometers, the solder mask including an electrically insulating binder material and a filler material dispersed in the binder material, the filler material having reflectance greater than about 85% at least between about 400 nanometers and about 470 nanometers.

2. The light emitting apparatus as set forth in claim 1, further comprising:
   a housing inside of which the one or more light emitting chips and the printed circuit board are disposed, the housing including a phosphor arranged to be irradiated by the one or more light emitting chips and emitting light in a wavelength range predominantly above 470 nanometers responsive to the irradiating, the phosphor and the printed circuit board being relatively arranged such that at least some of the light emitted by the one or more light emitting chips predominantly in the wavelength range between about 400 nanometers and about 470 nanometers reflects from the phosphor onto the solder mask of the printed circuit board.

3. The light emitting apparatus as set forth in claim 1, wherein the electrically insulating binder material is a photostabilized material.

4. The light emitting apparatus as set forth in claim 1, wherein the binder material is one of a photostabilized epoxy and a photostabilized polyimide.

5. The light emitting apparatus as set forth in claim 1, wherein the filler material is one of a titanium oxide and an aluminum oxide.

6. The light emitting apparatus as set forth in claim 1, wherein the filler material is one of $TiO_2$ and $Al_2O_3$.

7. The light emitting apparatus as set forth in claim 1, wherein the electrically insulating board comprises:
   a metal layer; and
   an electrically insulating layer disposed on at least one side of the metal layer, the printed circuitry being disposed on the electrically insulating layer.

8. A light emitting apparatus comprising:
   one or more light emitting chips emitting light predominantly in a wavelength range between about 400 nanometers and about 470 nanometers; and
   a printed circuit board on which the one or more light emitting chips are disposed, the printed circuit board including:
   (i) an electrically insulating board, (ii) electrically conductive printed circuitry, and (iii) an electrically insulating solder mask comprising a multiple-layer specular reflector sheet and having vias through which the one or more light emitting chips electrically contact the printed circuitry, the solder mask having a reflectance of greater than 60% at least between about 400 nanometers and about 470 nanometers.

9. The light emitting apparatus as set forth in claim 8, wherein the solder mask has a reflectance greater than about 85% at least between about 400 nanometers and about 470 nanometers.

10. The light emitting apparatus as set forth in claim 8, wherein the solder mask has a reflectance greater than 60% at least between about 400 nanometers and about 740 nanometers.

11. The light emitting apparatus as set forth in claim 8, wherein the solder mask has a reflectance greater than about 85% at least between about 400 nanometers and about 740 nanometers.

12. The light emittingapparatus as set forth in claim 8, wherein the multiple-layer specular reflector sheet comprises:
   a stack of reflective dielectric layers formed of alternating layers of dielectric material having different refractive indices, different birefringence characteristics, or other dissimilar optical characteristics.

13. The light emitting apparatus as set forth in claim 8, further comprising:
a phosphor arranged to be irradiated by the one or more light emitting chips and emitting light in a wavelength range predominantly above 470 nanometers responsive to the irradiating, the phosphor and the printed circuit board being relatively arranged such that at least some of the light emitted by the one or more light emitting chips predominantly in the wavelength range between about 400 nanometers and about 470 nanometers reflects from the phosphor onto the solder mask of the printed circuit board.

14. The light emitting apparatus as set forth in claim 13, wherein the solder mask has a reflectance greater than about 85% at least between about 400 nanometers and an upper wavelength substantially spanning the wavelength range of light emitted by the phosphor.

15. A method for fabricating a light emitting apparatus, the method comprising:
providing an electrically insulating board with electrically conductive printed circuitry disposed thereon;
disposing an electrically insulating solder mask having a reflectance of greater than 60% at least between about 400 nanometers and about 470 nanometers on the electrically insulating board by combining constituents of a photosensitive epoxy with a reflective filler material to generate epoxy source material, the reflective filler having a reflectance greater than about 85% at least between 400 nanometers and 470 nanometers, disposing the epoxy source material on the electrically insulating board to define an epoxy solder mask layer, and photolithographically forming the vias accessing the printed circuitry in the epoxy solder mask layer; and
disposing one or more light emitting chips on the insulating solder mask, the one or more light emitting chips electrically contacting the printed circuitry through the vias in the solder mask, the one or more light emitting chips emitting light emitting light predominantly in a wavelength range between about 400 nanometers and about 470 nanometers.

16. The method as set forth in claim 15, wherein the providing of an electrically insulating board comprises:
providing a metal core;
disposing an insulating layer on the metal core;
disposing a conductive layer on the insulating layer; and
patterning the conductive layer to define the electrically conductive printed circuitry.

17. The method as set forth in claim 15, wherein the disposing of the epoxy source material on the electrically insulating board includes disposing the epoxy source material by one of spray coating and curtain coating.

* * * * *